(12) United States Patent
Fukuzawa et al.

(10) Patent No.: US 12,027,191 B2
(45) Date of Patent: *Jul. 2, 2024

(54) FREE LAYER STRUCTURE IN MAGNETIC RANDOM ACCESS MEMORY (MRAM) FOR MO OR W PERPENDICULAR MAGNETIC ANISOTROPY (PMA) ENHANCING LAYER

(71) Applicant: Taiwan Semiconductor Manufacturing Company, Ltd., Hsin-Chu (TW)

(72) Inventors: Hideaki Fukuzawa, Santa Clara, CA (US); Vignesh Sundar, Sunnyvale, CA (US); Yu-Jen Wang, San Jose, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 396 days.

This patent is subject to a terminal disclaimer.

(21) Appl. No.: 17/397,700

(22) Filed: Aug. 9, 2021

(65) Prior Publication Data

US 2021/0375343 A1 Dec. 2, 2021

Related U.S. Application Data

(60) Continuation of application No. 16/844,154, filed on Apr. 9, 2020, now Pat. No. 11,087,810, which is a
(Continued)

(51) Int. Cl.
*G11C 11/16* (2006.01)
*B82Y 25/00* (2011.01)
(Continued)

(52) U.S. Cl.
CPC .......... *G11C 11/161* (2013.01); *B82Y 25/00* (2013.01); *H10N 50/01* (2023.02); *H10N 50/10* (2023.02); *H10N 50/85* (2023.02)

(58) Field of Classification Search
CPC ...... G11C 11/161; B82Y 25/00; H10N 50/01; H10N 50/10; H10N 50/85
See application file for complete search history.

(56) References Cited

U.S. PATENT DOCUMENTS 6,205,052 B1 * 3/2001 Slaughter ............ H01F 10/3254
365/158
6,452,204 B1 * 9/2002 Ishiwata ................ B82Y 10/00
(Continued)

FOREIGN PATENT DOCUMENTS

WO WO2017131584 8/2017

OTHER PUBLICATIONS

Luo, Yu-Ran, "Bond Dissociation Energies", Journal of Chemical Theory and Computation, Feb. 23, 2010, pp. 9-65 to 9-98, XP05533642, Chapter 1, Retrieved from the Internet: http://staff.ustc.edu.cn/~luo971/2010-91-CRC-BDEs-Tables.pdf.

*Primary Examiner* — Earl N Taylor
(74) *Attorney, Agent, or Firm* — Haynes and Boone, LLP (57) ABSTRACT

A perpendicularly magnetized magnetic tunnel junction (p-MTJ) is disclosed wherein a free layer (FL) has a first interface with a MgO tunnel barrier, a second interface with a Mo or W Hk enhancing layer, and is comprised of $Fe_xCo_yB_z$ wherein x is 66-80, y is 5-9, z is 15-28, and (x+y+z)=100 to simultaneously provide a magnetoresistive ratio >100%, resistance x area product <5 ohm/$\square m^2$, switching voltage <0.15V (direct current), and sufficient Hk to ensure thermal stability to 400° C. annealing. The FL may further comprise one or more M elements such as O or N to give $(Fe_xCo_yB_z)_wM_{100-w}$ where w is >90 atomic %. Alternatively, the FL is a trilayer with a FeB layer contacting
(Continued)

MgO to induce Hk at the first interface, a middle FeCoB layer for enhanced magnetoresistive ratio, and a Fe or FeB layer adjoining the Hk enhancing layer to increase thermal stability.

20 Claims, 7 Drawing Sheets

Related U.S. Application Data division of application No. 15/933,479, filed on Mar. 23, 2018, now Pat. No. 10,622,047.

(51) Int. Cl.
*H10N 50/01* (2023.01)
*H10N 50/10* (2023.01)
*H10N 50/85* (2023.01)

(56) References Cited

U.S. PATENT DOCUMENTS

| | | | | |
|---|---|---|---|---|
| 6,649,690 B2* | 11/2003 | Kraft | ................ | C08G 65/34 524/789 |
| 6,649,960 B1 | 11/2003 | Cross | | |
| 6,760,250 B2* | 7/2004 | Kajiyama | ................ | G11C 11/15 365/158 |
| 7,009,877 B1* | 3/2006 | Huai | ................ | H10B 61/22 257/E27.005 |
| 7,276,384 B2* | 10/2007 | Parkin | ................ | H01F 41/307 438/257 |
| 7,595,520 B2* | 9/2009 | Horng | ................ | B82Y 25/00 365/158 |
| 7,598,579 B2* | 10/2009 | Horng | ................ | H10N 50/10 365/158 |
| 7,839,605 B2* | 11/2010 | Parker | ................ | G01R 33/091 360/321 |
| 8,372,661 B2* | 2/2013 | Horng | ................ | H10N 50/10 257/295 |
| 8,498,150 B2* | 7/2013 | Ranjan | ................ | H01F 41/303 365/158 |
| 8,541,855 B2* | 9/2013 | Jan | ................ | G11C 11/161 257/E27.008 |
| 8,673,654 B2* | 3/2014 | Hong | ................ | G11B 5/3909 257/E21.665 |
| 8,871,365 B2* | 10/2014 | Wang | ................ | G11C 11/161 428/811.5 |
| 8,953,369 B2* | 2/2015 | Nagase | ................ | H01F 10/3286 365/158 |
| 9,048,411 B2* | 6/2015 | Jan | ................ | H10N 50/80 |
| 9,177,574 B2* | 11/2015 | Fuji | ................ | B82Y 25/00 |
| 9,472,752 B2* | 10/2016 | Wang | ................ | H03B 15/006 |
| 9,780,299 B2* | 10/2017 | Zhu | ................ | H10N 50/01 |
| 10,622,047 B2* | 4/2020 | Fukuzawa | ................ | H01F 10/3286 |
| 2004/0087163 A1 | 5/2004 | Steimle et al. | | |
| 2005/0164414 A1* | 7/2005 | Deak | ................ | B82Y 25/00 257/E43.006 |
| 2005/0184838 A1 | 8/2005 | Nguyen et al. | | |
| 2006/0198063 A1* | 9/2006 | Fukuzawa | ................ | G11B 5/3932 360/324.12 |
| 2006/0209473 A1* | 9/2006 | Oshima | ................ | G11B 5/3903 |
| 2007/0087163 A1* | 4/2007 | Lasly | ................ | B60N 3/048 428/131 |
| 2007/0183187 A1* | 8/2007 | Guo | ................ | G11C 11/16 365/158 |
| 2007/0243639 A1* | 10/2007 | Pietambaram | ................ | H01F 10/3254 360/324.11 |
| 2009/0021869 A1* | 1/2009 | Kamiguchi | ................ | G11B 5/39 360/324.1 |
| 2009/0257151 A1* | 10/2009 | Zhang | ................ | G01R 33/1284 427/127 |
| 2010/0073828 A1* | 3/2010 | Wang | ................ | B82Y 10/00 |
| 2010/0109110 A1* | 5/2010 | Wang | ................ | G11C 11/161 257/E29.323 |
| 2011/0293967 A1* | 12/2011 | Zhang | ................ | G11B 5/66 428/827 |
| 2012/0299134 A1* | 11/2012 | Jan | ................ | H10N 50/85 257/E29.323 |
| 2013/0062715 A1* | 3/2013 | Chen | ................ | G11C 11/161 257/E29.323 |
| 2013/0175644 A1* | 7/2013 | Horng | ................ | B82Y 40/00 257/E29.323 |
| 2014/0070341 A1* | 3/2014 | Beach | ................ | H10N 50/10 257/E29.323 |
| 2014/0332916 A1* | 11/2014 | Yamane | ................ | H10N 50/10 257/421 |
| 2019/0295615 A1* | 9/2019 | Fukuzawa | ................ | H10N 50/10 |

* cited by examiner

FIG. 14

FREE LAYER STRUCTURE IN MAGNETIC RANDOM ACCESS MEMORY (MRAM) FOR MO OR W PERPENDICULAR MAGNETIC ANISOTROPY (PMA) ENHANCING LAYER

PRIORITY DATA

The present application is a continuation application of U.S. patent application Ser. No. 16/844,154, filed Apr. 9, 2020, which is a divisional application of U.S. patent application Ser. No. 15/933,479, filed Mar. 23, 2018, each of which is herein incorporated by reference in its entirety.

RELATED PATENT APPLICATIONS

This application is related to the following: U.S. Pat. Nos. 8,372,661; 9,472,752; and 9,780,299; which are herein incorporated by reference in their entirety.

TECHNICAL FIELD

The present disclosure relates to a perpendicularly magnetized magnetic tunnel junction (p-MTJ) comprised of a free layer that has a first interface with a tunnel barrier layer and a second interface with a metal PMA (Hk) enhancing layer such as Mo or W that increases PMA and thermal stability in the free layer while reducing a resistance x area (RA) product compared with a p-MTJ having a metal oxide Hk enhancing layer, and optimizing a figure of merit A where A is the product of Hk and the magnetoresistive (MR) ratio in order to satisfy magnetic performance requirements for advanced MRAM products.

BACKGROUND

Perpendicularly magnetized MTJs (p-MTJs) are a major emerging technology for use in embedded magnetic random access memory (MRAM) applications, and standalone MRAM applications. P-MTJ MRAM technology that uses spin-torque (STT-MRAM) for writing of memory bits was described by C. Slonczewski in "Current driven excitation of magnetic multilayers", J. Magn. Magn. Mater. V 159, L1-L7 (1996), and is an increasingly promising candidate for future generations of non-volatile memory to replace embedded flash memory and embedded cache memory (SRAM).

Both MRAM and STT-MRAM have a p-MTJ cell based on a tunneling magnetoresistance (TMR) effect wherein a stack of layers has a configuration in which two ferromagnetic layers are separated by a thin insulating tunnel barrier layer such as MgO. One of the ferromagnetic layers called the pinned layer has a magnetic moment that is fixed in an out-of-plane direction such as the +z direction when the plane of each layer is laid out in the x-axis and y-axis directions. The second ferromagnetic layer has an out-of-plane magnetization direction that is free to rotate to either the +z-axis (parallel or P state) or the −z-axis (antiparallel or AP state) direction. The difference in resistance between the P state (Rp) and AP state (Rap) is characterized by the equation (Rap−Rp)/Rp also known as DRR or the MR ratio. It is important for p-MTJ cells to have a large MR ratio, preferably higher than 100%, as the MR ratio is directly related to the read margin for the memory bit, or how easy it is to differentiate between the P state and AP state (0 or 1 bits).

Another critical requirement for p-MTJs is thermal stability during 400° C. process temperatures that are typical of back-end-of-line (BEOL) processes when fabricating embedded memory devices in complementary metal-oxide-semiconductor (CMOS) products. A general trend has been to introduce a second metal oxide/free layer (FL) interface similar to the tunnel barrier/FL interface thereby enhancing PMA and Hk within the free layer, and improving thermal stability. Unfortunately, a consequence of employing a Hk enhancing (cap) layer such as MgO on the free layer is the addition of parasitic resistance to the p-MTJ. Equation (1) shows the effect of the cap layer resistance contribution to total p-MTJ resistance while Equation (2) indicates the impact on DRR (MR ratio).

$$DRR = \frac{R_{AP} - R_P}{R_P} \text{ where } R_{AP} = R_{AP}^{barier} + R_{AP}^{cap} \text{ and } R_P = R_P^{barrier} + R_P^{cap} \quad \text{Eq. (1)}$$

$$\text{Since } R_{AP}^{cap} = R_P^{cap}$$

$$DRR = \frac{R_{AP}^{barier} + R_{AP}^{cap} - (R_P^{barrier} + R_P^{cap})}{R_P^{barrier} + R_P^{cap}} = \frac{R_{AP}^{barier} - R_{AP}^{cap}}{R_P^{barrier} + R_P^{cap}} \quad \text{Eq. (2)}$$

In summary, the series resistance ($R_{AP}^{cap}$ and $R_P^{cap}$) caused by the metal oxide cap layer will cause a reduction in DRR, unfortunately reducing the MRAM bit reading margin as well as increasing the bit's writing voltage by adding a series resistance. Therefore, an alternative p-MTJ cell structure is needed that features a RA product preferably less than 5 ohm-□m² for advanced memory products while achieving an acceptable Hk (PMA) for enhanced thermal stability, and increasing the MR ratio above 100% while minimizing switching voltage (Vc).

SUMMARY

One objective of the present disclosure is to reduce the switching voltage and resistance x area (RA) product for p-MTJ cells while optimizing Hk and the MR ratio to provide the overall magnetic performance necessary to satisfy requirements for advanced embedded memory products.

A second objective is to provide a method of forming the p-MTJ of the first objective that is readily implemented in embedded memory devices found in CMOS products.

According to one embodiment of the present disclosure, a p-MTJ configuration is provided where a free layer is formed between a metal oxide tunnel barrier layer and a metal Hk enhancing layer such as W or Mo in order to minimize the RA product, and increase the MR ratio by removing the $R_P^{cap}$ contribution to equation (2) described previously. The p-MTJ may have a bottom spin valve configuration with the tunnel barrier layer below the free layer, or a top spin valve configuration with the free layer below the tunnel barrier layer.

The free layer may be a single layer as deposited and comprises at least Fe, Co, and B. In some embodiments, one or more additional elements (M) such as oxygen, nitrogen or a metal from an adjacent layer diffuse into the free layer during p-MTJ fabrication to give a final free layer composition that is $(Fe_xCo_yB_z)_wM_{100-w}$ where x is 66-80, y is 5-9, z is 15-28, x+y+z=100, and w>90 atomic %. Moreover, the free layer thickness is preferably from 8 to 15 Angstroms to realize a small switching voltage ($V_C$) <0.15V (direct current or DC) since $V_C$ is proportional to the magnetization volume of the free layer. It is believed that a certain degree of segregation occurs during one or more annealing steps after the MTJ stack of layers is formed so that the final p-MTJ structure may have a free layer with a FeB/FeCoB or FeCoB/FeB bilayer configuration, or even a FeB/FeCoB/FeB or FeB/FeCoB/Fe trilayer stack where a lower layer contacting the tunnel barrier has a FeB composition, a middle portion maintains a FeCoB composition, and an upper layer contacting the Hk enhancing layer in a bottom spin valve embodiment has a Fe or FeB composition. When one or more M elements are present, M may be unevenly dispersed within the free layer depending on the atomic number of M and the bond strength of an M atom with the other atoms in the free layer.

According to a second embodiment, a free layer has a trilayer stack as deposited and is formed with a FeB/FeCoB/Fe or FeB/FeCoB/FeB configuration between a tunnel barrier and a Mo or W Hk enhancing layer. In other words, a first layer that contacts the tunnel barrier is comprised of Fe and B. In particular, when the tunnel barrier is MgO, a MgO/FeB interface provides enhanced Hk compared with a MgO/CoFeB interface, for example. However, a free layer consisting only of FeB does not meet the objectives of the present disclosure since a high MR ratio is not realized simultaneously with enhanced Hk. Therefore, a certain amount of Co is employed in the iron rich FeCoB middle layer. Since Co has a lower affinity for oxygen than Fe, Co is advantageously used in the middle portion of the free layer to block oxygen migration from the tunnel barrier layer to the third layer (Fe or FeB) thereby maintaining Hk that results from the third layer interface with the W or Mo Hk enhancing layer. The addition of Co to a FeB alloy also enhances the MR ratio. Furthermore, the trilayer thickness is preferably from 8 to 15 Angstroms so that Vc is minimized. A total composition of the trilayer structure is ($Fe_xCo_yB_z$) where x is 66-80, y is 5-9, z is 15-28, and x+y+z is 100, or the ($Fe_xCo_yB_z$)$_w M_{100-w}$ composition described earlier wherein w>90 atomic % when one or more M elements are incorporated into the trilayer during p-MTJ fabrication.

Another key feature of the trilayer embodiment is that the third layer portion contacting the Mo or W Hk enhancing layer must be Fe or Fe-rich material to minimize or avoid a dead zone. Otherwise, for the case of alloys such as CoFeB, there is intermixing with the Mo or W layer that results in a dead zone with substantially reduced PMA. Thus, a Fe or Fe-rich FeB layer has essentially no intermixing with W or Mo and thereby provides a maximum Hk contribution to PMA within the free layer from the Fe/Hk enhancing layer interface or from the FeB/Hk enhancing layer interface.

The present disclosure also encompasses a method of forming a free layer between a tunnel barrier and a W or Mo Hk enhancing layer wherein the free layer is formed in multiple steps. In one embodiment, a first layer comprised of Fe and B is deposited on the tunnel barrier layer. Then, a FeCoB layer that comprises more Co than in the first layer is deposited to give a FeB/FeCoB stack, for example. Thereafter, a third layer is deposited on the FeCoB layer and is FeB or Fe having a Fe content that is greater than the Fe content in the FeCoB layer. After a W or Mo Hk enhancing layer is deposited on the free layer, and optionally a hard mask on the W or Mo layer, the p-MTJ stack is annealed at a temperature >380° C. The annealing may comprise one or more steps that occur before or after the p-MTJ stack of layers is patterned into a plurality of p-MTJ cells.

In an alternative embodiment, a $Fe_xCo_yB_z$ single layer is deposited on the tunnel barrier layer, and then a W or Mo Hk enhancing layer is formed on the $Fe_xCo_yB_z$ free layer. After an optional hard mask is deposited, the resulting MTJ stack of layers is annealed at a temperature >380° C. thereby causing segregation in the $Fe_xCo_yB_z$ free layer to yield a free layer that is a FeB/FeCoB or FeCoB/FeB bilayer, or that is a trilayer with a FeB/FeCoB/Fe or FeB/FeCoB/FeB configuration.

DETAILED DESCRIPTION

The present disclosure is related to p-MTJ cells and the fabrication thereof wherein thermal stability, MR ratio, RA product, and switching voltage are simultaneously optimized for embedded memory applications. A key feature is a free layer comprised of $Fe_xCo_yB_z$ where x is 66-80, y is 5-9, and z is 15-28, and x+y+z=100, and the free layer forms a first interface with a tunnel barrier layer and a second interface with a Mo or W Hk enhancing layer in a p-MTJ. In some embodiments, one or more elements M may diffuse into the free layer during p-MTJ fabrication to give a $(Fe_xCo_yB_z)_wM_{100-w}$ composition where w>90 atomic %. The p-MTJ may be incorporated in a MRAM, STT-MRAM, or another spintronic device such as a spin torque oscillator (STO), sensor, or biosensor. Only one p-MTJ cell is depicted in the drawings, but typically millions of p-MTJ cells are arrayed in rows and columns on a substrate during fabrication of a memory device. A top surface for a layer is defined as a surface facing away from the substrate while a bottom surface faces the substrate. An interface is a boundary region comprised of a bottom surface of one layer and an adjoining top surface of a second layer. A thickness of each layer is in the z-axis direction, and a plane (top or bottom surface) is laid out in the x-axis and y-axis directions.

For advanced technology nodes, especially for MRAM and STT-MRAM cells having a critical dimension (CD) <60 nm, there is a difficult challenge to simultaneously satisfy important requirements including thermal stability to 400° C. process temperatures, MR ratio above 100%, RA product <5 ohm-$\square m^2$, and switching voltage <0.15V (DC), and preferably <0.1V (DC). P-MTJ cell improvements in the prior art address two or at most three of the aforementioned requirements but fail to satisfy all four of these performance needs. The present disclosure provides a solution to meet all of the aforementioned requirements. However, the present disclosure is not limited to high-end memory devices and also provides the simultaneous benefits of 400° C. thermal stability, MR ratio >100%, and switching voltage <0.15V (DC) for applications where an RA product >5 ohm-$\square m^2$ is acceptable.

In related U.S. Pat. No. 8,372,661, we disclosed a Fe/CoFeB/Fe trilayer configuration for a free layer that was designed to reduce switching current. Although MR ratios above 100% were achieved, the RA product was from 8 to 10 ohm-$\square m^2$ while thermal stability and Hk were not discussed. Also, in related U.S. Pat. No. 9,780,299, we disclosed that improved seed layer stacks with a higher degree of uniformity (top surface smoothness) than previously realized translate to improved thermal stability at 400° C. However, other magnetic performance related parameters were not discussed.

Now we have found that all performance requirements mentioned earlier are achieved in a p-MTJ cell comprised of a tunnel barrier/free layer/Mo or W Hk enhancing layer stack or with a Mo or W Hk enhancing layer/free layer/ tunnel barrier stack, and wherein the free layer comprises $Fe_xCo_yB_z$ where x is 66-80, y is 5-9, z is 15-28, and x+y+z=100.

Figure 1:
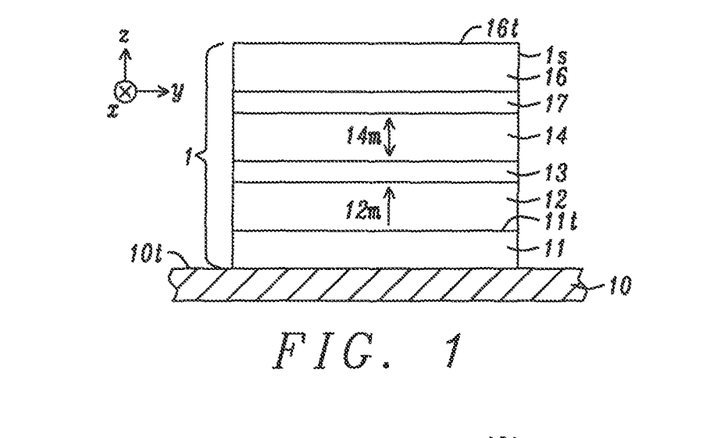
FIG. 1 is a cross-sectional view showing a p-MTJ wherein a free layer is formed between a tunnel barrier layer and a Mo or W Hk enhancing layer in a bottom spin valve configuration according to an embodiment of the present disclosure.

FIG. 1 depicts a patterned p-MTJ 1 according to a first embodiment of the present disclosure wherein an optional seed layer 11, pinned layer 12, tunnel barrier layer 13, free layer 14, Hk enhancing layer 17, and hard mask 16 are sequentially formed on a top surface 10t of a substrate that is a bottom electrode 10 in a MRAM structure, for example. Sidewall is on the p-MTJ cell is formed during a conventional photoresist patterning and etching sequence where a pattern formed in a photoresist layer (not shown) on top surface 16t of the hard mask is etch transferred through the underlying p-MTJ stack of layers as explained later. Free layer magnetization 14m is free to rotate parallel or anti-parallel to the pinned layer magnetization 12m in this bottom spin valve embodiment.

Figure 2:
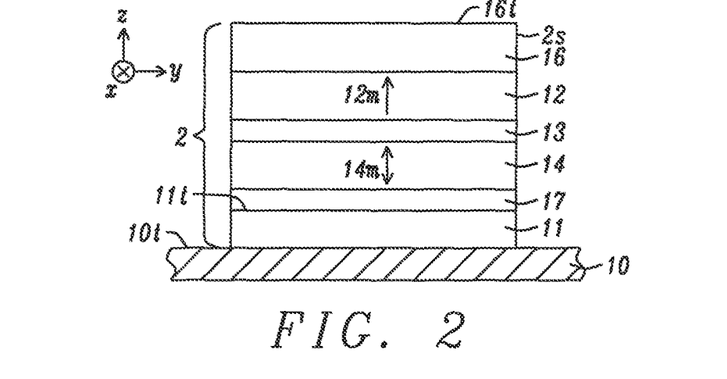
FIG. 2 is a cross-sectional view showing a p-MTJ wherein a free layer is formed between a Mo or W Hk enhancing layer and a tunnel barrier layer in a top spin valve configuration according to another embodiment of the present disclosure.

According to another embodiment of the present disclosure shown as p-MTJ 2 in FIG. 2, a top spin valve configuration is illustrated where the p-MTJ layers are retained from FIG. 1 except they are stacked in a different order. Here, the optional seed layer 11, Mo or W Hk enhancing layer 17, free layer 14, tunnel barrier 13, reference layer 12, and hard mask 16 are sequentially formed on a substrate comprised of an uppermost bottom electrode 10. The seed layer is comprised of one or more of NiCr, Ta, Ru, Ti, TaN, Cu, Mg, or other materials typically employed to promote a smooth and uniform grain structure in overlying layers. In related U.S. Pat. No. 9,780,299, we described one of the preferred seed layer configurations that is a TaN/Mg/CoFeB/NiCr stack of layers in order to provide an especially smooth top surface 11t that improves magnetic properties in overlying layers.

Figure 3:
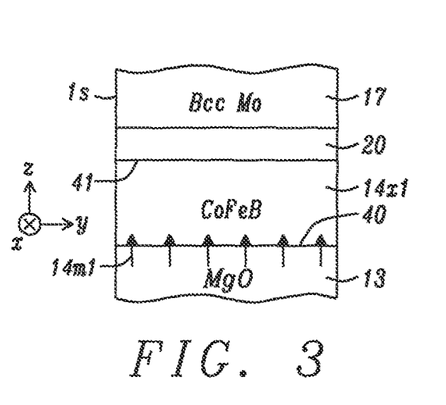
FIG. 3 depicts a p-MTJ previously fabricated by the inventors wherein a CoFeB layer is formed between a MgO tunnel barrier and a Mo cap layer, which results in an intermixing layer.

Referring to FIG. 3, we have previously fabricated p-MTJ cells comprised of a MgO tunnel barrier 13, CoFeB free layer 14x1, and Mo Hk enhancing layer 17 having a bcc crystal structure. Although the MgO/CoFeB interface 40 generates PMA that induces magnetization 14m1, we observe there is intermixing between the CoFeB free layer (FL) and Mo Hk enhancing layer whereby a dead zone 20 is formed that essentially prevents PMA to be induced at the original FL/Mo interface 41. As a result, thermal stability suffers because of the lack of a second Hk contribution from interface 41 that is needed to enhance PMA in the free layer.

Figure 4:
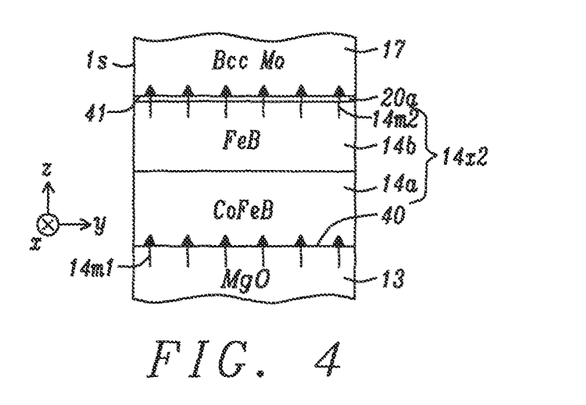
FIG. 4 is a cross-sectional view of a p-MTJ wherein the free layer is a CoFeB/FeB bilayer to substantially reduce or avoid the intermixing layer at an interface with an overlying Mo layer.

Referring to FIG. 4, we have modified the p-MTJ cell in FIG. 3 to include a bilayer scheme to yield a free layer 14x2 where an upper layer 14b that is FeB contacts the Mo layer 17 at interface 41 to substantially reduce or prevent the intermixing region 20a. Here, we find an additional Hk contribution (magnetization 14m2) that together with magnetization 14m1 at interface 40 provides enhanced PMA for the free layer compared with the FL structure in FIG. 3. However, due to the unoptimized composition of the lower CoFeB layer 14a, the MR ratio for free layer 14x2 is generally too low to be acceptable for advanced MRAM and STT-MRAM applications.

To our knowledge, the role of the free layer composition at interface 41 with a Mo or W Hk enhancing layer 17 (also known as a cap layer in a bottom spin valve configuration) has not been previously addressed with regard to intermixing between FL 14 and the Hk enhancing layer. In particular, our observation that an uppermost Fe or FeB sub-layer in a composite free layer 14 in FIG. 1 (or a bottommost Fe or FeB sub-layer in free layer 14 in FIG. 2) prevents undesirable intermixing with Mo or W in Hk enhancing layer 17 is a key feature of the present disclosure. In other words, optimum Hk at interface 41 and sufficient PMA in free layer 14 to provide acceptable thermal stability at 400° C. process temperatures is achieved with a Fe/Mo, Fe/W, FeB/Mo, or FeB/W interface according to embodiments described herein.

Figure 7:
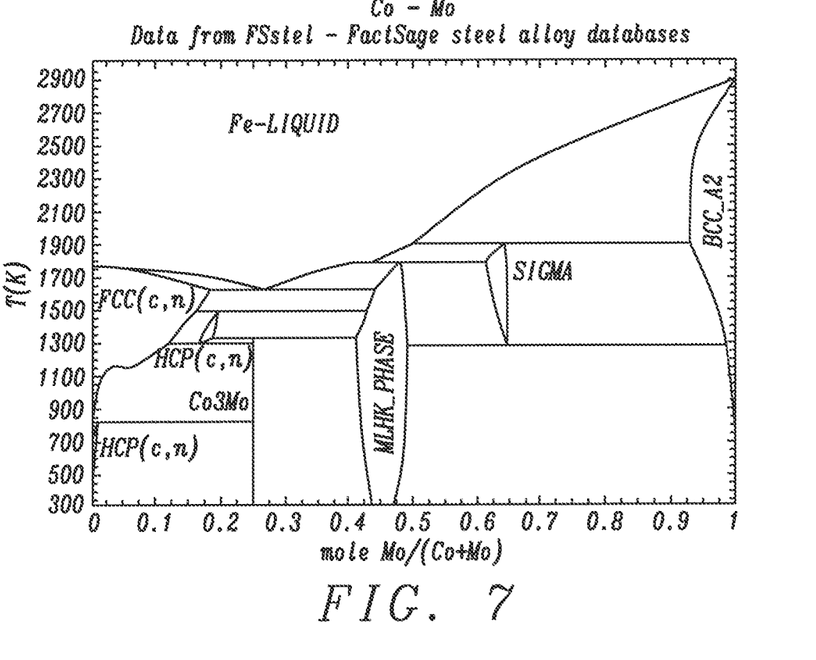
FIGS. 7-8 are phase diagrams for Co—Mo and Fe—Mo, respectively, that indicate solubility of Co in Mo, and insolubility of Fe with Mo at CMOS process temperatures.
Figure 8:
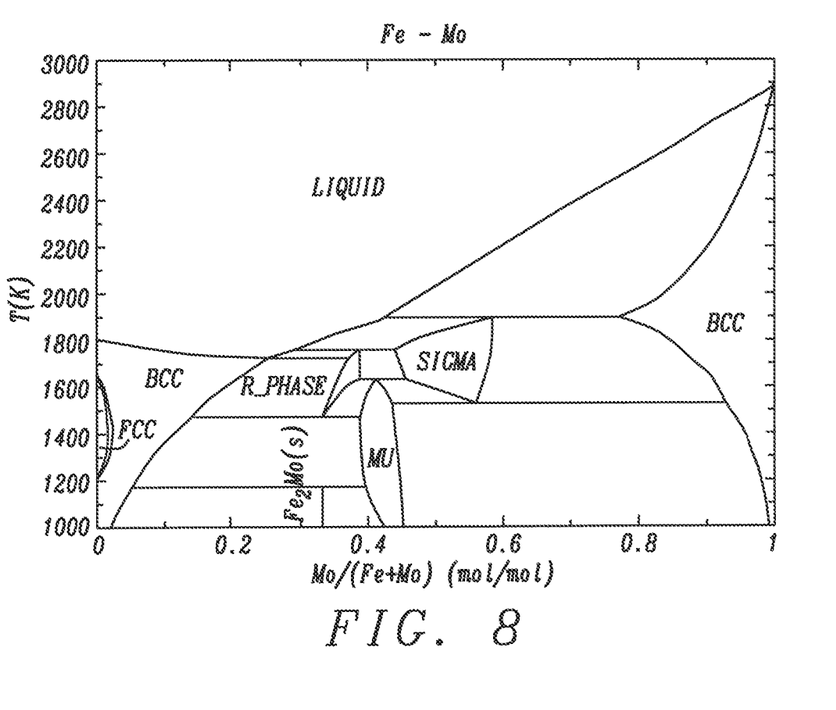

The intermixing behavior in FIG. 3 and lack thereof in FIG. 4 is supported by information found in phase diagrams in the Fact Sage steel database. Referring to FIG. 7, a Co—Mo phase diagram indicates solubility (intermixing) of Mo and Co at typical CMOS process temperatures. On the other hand, in FIG. 8, a corresponding Fe—Mo phase diagram indicates essentially no intermixing of Fe with Mo at typical CMOS process temperatures.

Returning to FIGS. 1-2, reference layer 12 may have a synthetic anti-parallel (SyAP) configuration represented by AP2/Ru/AP1 where an anti-ferromagnetic coupling layer made of Ru, Rh, or Ir, for example, is sandwiched between an AP2 magnetic layer and an AP1 magnetic layer (not shown). The AP2 (outer pinned) layer is formed on the seed layer 11 in FIG. 1 or adjoins the hard mask 16 in FIG. 2. AP1 is the inner pinned layer and typically contacts the tunnel barrier.

One or both of the AP1 and AP2 layers may be comprised of CoFe, CoFeB, Fe, Co, or a combination thereof. In other embodiments, one or both of the AP1 and AP2 layers may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a dusting layer that is Co or a Co rich alloy may be inserted between the AFM coupling layer and each of the AP1 and AP2 layers to yield an AP2/Co/Ru/Co/AP1 reference layer configuration with enhanced PMA and thermal stability as we disclosed in related U.S. Pat. No. 9,472,752.

Tunnel barrier layer 13 is preferably a metal oxide that is one of MgO, TiOx, AlTiO, MgZnO, $Al_2O_3$, ZnO, ZrOx, HfOx, or MgTaO, or a lamination of one or more of the aforementioned metal oxides. More preferably, MgO is selected as the tunnel barrier layer because it provides the highest MR ratio (DRR).

The Mo or W Hk enhancing layer 17 has a thickness from 10 to 50 Angstroms, and preferably 20 to 30 Angstroms. In some embodiments, a MoW alloy may be used as the Hk enhancing layer, or a MoD alloy or WD alloy where D is one of Nb, Ti, Ta, Zr, Hf, V, or Cr, and wherein the D content is less than 20 atomic %.

Hard mask 16 is non-magnetic and generally comprised of one or more conductive metals or alloys including but not limited to Ta, Ru, TaN, Ti, TiN, and W. It should be understood that other hard mask materials including MnPt may be selected in order to provide high etch selectivity relative to underlying MTJ layers during an etch process that forms MTJ cells with sidewalls that stop on the bottom electrode. Moreover, the hard mask may comprise an electrically conductive oxide such as RuOx, ReOx, IrOx, MnOx, MoOx, TiOx, or FeOx.

Figure 5:
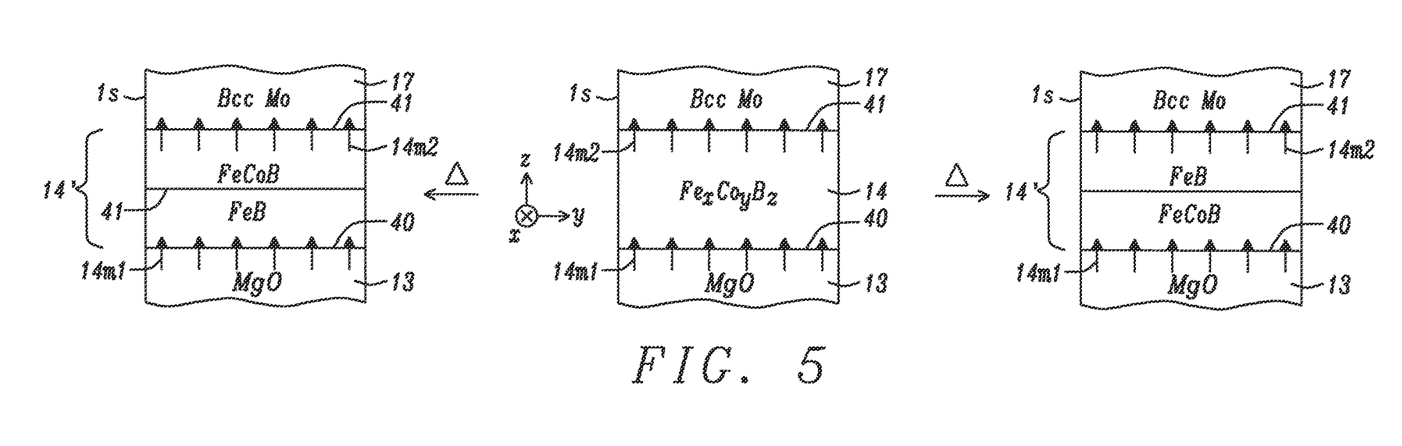
FIG. 5 is a cross-sectional view of a p-MTJ wherein a $Fe_xCo_yB_z$ free layer is formed between a MgO tunnel barrier and a Mo Hk enhancing layer, and may segregate to a FeCoB/FeB or FeB/FeCoB bilayer during annealing according to a first embodiment of the present disclosure.

According to a first embodiment of the present disclosure shown in FIG. 5, free layer 14 has a $Fe_xCo_yB_z$ composition as deposited where x is 66-80, y is 5-9, z is 15-28, and x+y+z=100. However, after one or more annealing steps during subsequent memory device fabrication, one or more M elements where M is a metal, oxygen, or nitrogen from the underlying tunnel barrier layer (or Hk enhancing layer or another adjacent layer) may diffuse into the FL to yield a $(Fe_xCo_yB_z)_wM_{100-w}$ composition where w>90 atomic %. Moreover, the $Fe_xCo_yB_z$ free layer may segregate into two or more sub-layers. Thus, the present disclosure anticipates that the free layer in FIG. 1 or FIG. 2 may transform to a bilayer 14' with a FeB/FeCoB or FeCoB/FeB configuration after annealing or exposure to process temperatures >380° C. Note that after segregation occurs, the "total" composition of the FL may be maintained as $Fe_xCo_yB_z$. Hk contribution 14m1 at interface 40 and Hk contribution 14m2 at interface 41 both contribute to FL magnetization 14m in FIG. 1 and FIG. 2.

Figure 6A:
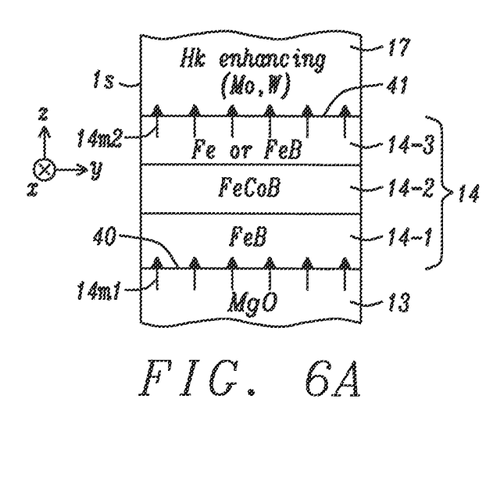
FIGS. 6A-6B are cross-sectional views of a p-MTJ with a bottom spin valve and top spin valve configuration, respectively, wherein a free layer with a FeB/FeCoB/Fe or FeB/FeCoB/FeB trilayer configuration and a total composition equivalent to $Fe_xCo_yB_z$ is formed between a MgO tunnel barrier and a Hk enhancing layer according to a second embodiment of the present disclosure.

Referring to FIG. 6A, a second embodiment of the present disclosure is depicted where free layer 14 has a trilayer configuration that is formed by sequentially depositing a FeB layer 14-1 on a tunnel barrier 13 such as MgO in a bottom spin valve p-MTJ structure, a FeCoB middle layer 14-2, and an uppermost Fe or FeB layer 14-3 where a total composition of free layer 14 is $Fe_xCo_yB_z$ described previously. The Hk enhancing layer 17 such as Mo, W, or a Mo alloy or W alloy described earlier is then deposited on the uppermost Fe or FeB layer followed by a hard mask 16 depicted in FIG. 1. In a top spin valve embodiment shown in FIG. 6B, the sequence is reversed where Fe or FeB layer 14-3, FeCoB middle layer 14-2, and FeB layer 14-1 are sequentially deposited on the Hk enhancing layer. Thereafter, the tunnel barrier is formed on layer 14-1 followed by the reference layer 12 and hard mask 16 as shown in FIG. 2. As in the previous embodiment, the FL may have a $(Fe_xCo_yB_z)_wM_{100-w}$ composition if one or more M elements diffuse into one or more layers 14-1, 14-2, 14-3 during subsequent processing steps at temperatures >380° C.

Figure 6B:
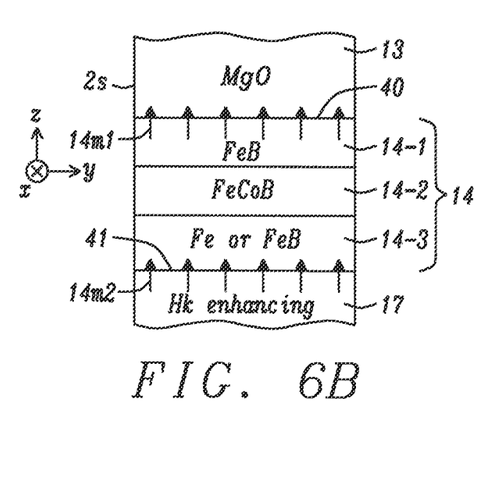

The benefits of the trilayer stack for free layer 14 shown in FIGS. 6A-6B are that all four of the p-MTJ objectives of the present disclosure are simultaneously realized. In particular, when the tunnel barrier 13 is MgO, an interface 40 with FeB layer 14-1 provides enhanced Hk 14m1 compared with a MgO/CoFeB interface in FIG. 4, for example. However, a free layer consisting only of FeB does not meet the objectives of the present disclosure since a high MR ratio is not realized simultaneously with enhanced Hk. Therefore, a certain amount of Co is employed in the iron rich FeCoB middle layer 14-2. Since Co has a lower affinity for oxygen than Fe, Co is advantageously used in the middle portion of the free layer to block oxygen migration from the tunnel barrier layer to the Fe or FeB layer 14-3 thereby maintaining Hk 14m2 that results from interface 41 with the Hk enhancing layer 17. The addition of Co to a FeB alloy in middle layer 14-2 also enhances the MR ratio.

The thickness of free layer 14 is preferably from 8 to 15 Angstroms so that Vc is minimized, and a total composition of the trilayer structure should be equivalent to $Fe_xCo_yB_z$ described previously. It is also important that layer 14-3 contacting the Hk enhancing layer is Fe or an Fe-rich material to minimize or avoid a dead zone having substantially reduced PMA or no PMA that results when Co or a Co alloy such as CoFeB intermixes with a W, Mo, Mo alloy, or W alloy layer. Thus, a Fe or Fe-rich FeB layer has essentially no intermixing with W, Mo, or alloys thereof and thereby provides a maximum Hk value resulting from interface 41. An Fe rich FeB layer is defined as a layer with a Fe content ≥50 atomic %. Preferably, the Fe content is ≥70 atomic %, and more preferably is ≥90 atomic %.

To demonstrate the benefits of the p-MTJ configurations disclosed herein, we performed an experiment to compare p-MTJ configurations having various free layers (comparative examples) formed during our past p-MTJ development projects with those formed according to the embodiments described herein. The base film structure employed for all p-MTJ stacks is TaN20/Mg7/CoFeB9/NiCr50/(Ni6/Co1.8)$_3$/Co5/Ru4/Co5/Mo2/CoFeB4/Fe5/MgO/free layer 12/Mo20/Ta15/Ru100 where the thickness of each layer is shown in Angstroms. Total free layer thickness in each example is 12 Angstroms. In the base film structure, TaN/Mg/CoFeB/NiCr is the seed layer, (Ni/Co)$_3$ is the AP2 layer, the Ru AFM coupling layer is sandwiched between two Co dusting layers, the first Mo layer is a Hk enhancing layer for the overlying AP1 layer, CoFeB/Fe is the AP1 layer that adjoins the MgO tunnel barrier, the second Mo layer is the Hk enhancing layer for the FL, and Ta/Ru is the hard mask. The Mo layer next to AP1 also serves as a bridge (crystal decoupling) between the underlying Co dusting layer with a fcc(111) structure and overlying CoFeB with a bcc(002) crystal structure.

After all p-MTJ layers were deposited, each stack was annealed at 400° C. for 140 minutes to confirm thermal tolerance to typical 400° C. processes. Actual RA product results for all examples are within 3-4 ohm/$\square m^2$ and thus satisfactory for advanced embedded memory products having a CD<60 nm. MR ratio and Hk were measured after annealing, and a comparison was made among stacks by using a figure of merit A where A is the product of MR ratio and Hk (in arbitrary units). A relative merit of 0 is given when A<1000, 1 is for A between 1000 and 1100, 2 is for A between 1100 and 1200, 3 is for A between 1200 and 1300, 4 is for A between 1300 and 1400, and 5 (best result) is for A above 1400.

Figure 9:
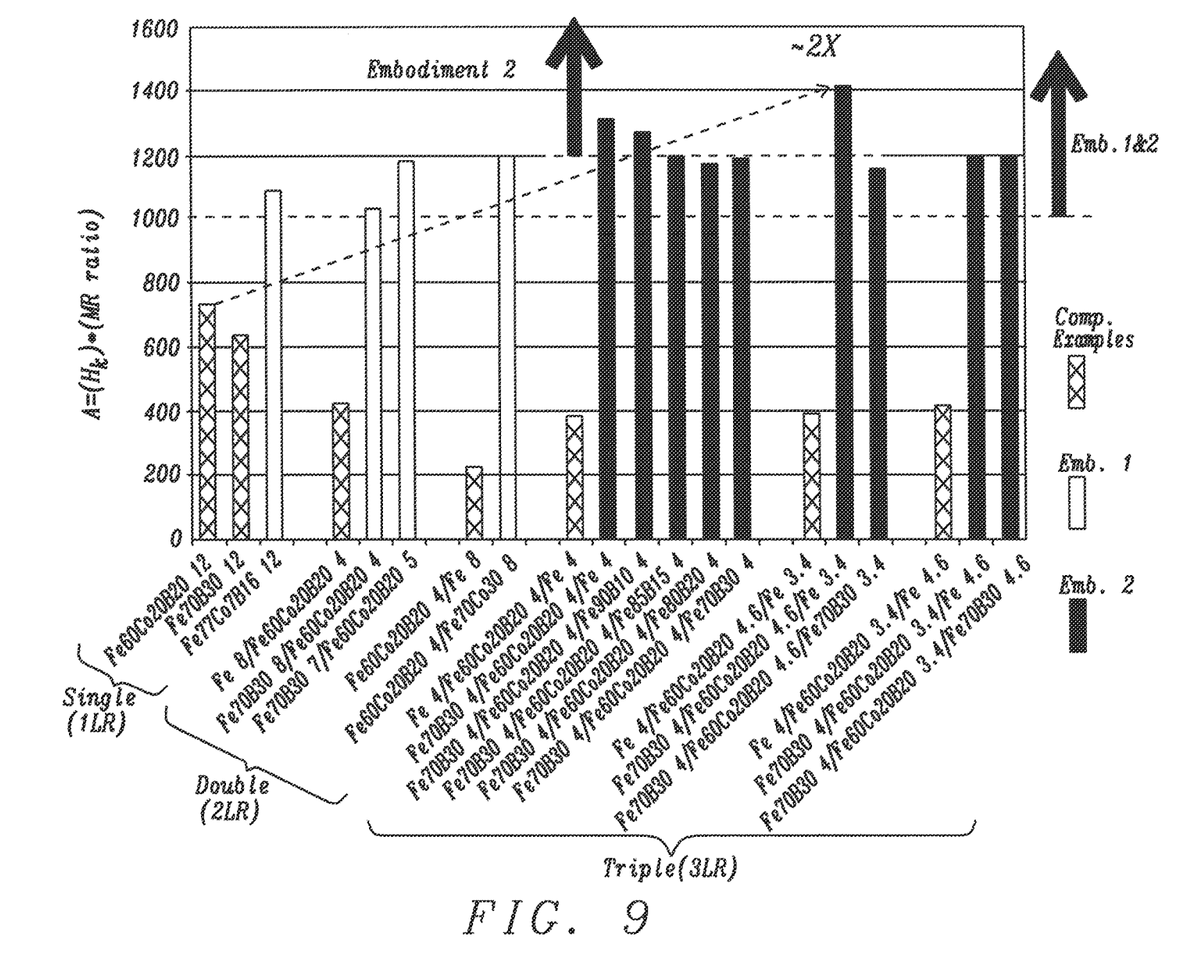
FIG. 9 is a bar chart that shows a comparison of free layer compositions previously fabricated by the inventors with embodiments of the present disclosure with regard to a figure of merit A where A is the product of Hk and MR ratio.

With regard to Table 1, the most common single free layer composition in our earlier development efforts is $Fe_{60}Co_{20}B_{20}$ and listed as Comp. Ex. 1, and a second popular composition is $Fe_{70}Co_{30}$ (Comp. Ex. 2). Both have an A result below 1000. However, a single layer composition $Fe_{77}Co_7B_{16}$ according to Embodiment 1 improves performance significantly. Our earlier bilayer configurations are listed as $Fe8/Fe_{60}Co_{20}B_{20}4$ and $Fe_{60}Co_{20}B_{20}4/Fe8$, or Comp. Ex. 3 and Comp. Ex. 4, respectively, and show no improvement over the single layer baseline results. On the other hand, bilayer configurations according to Embodiment 1, which are represented as $Fe_{70}B_{30}8/Fe_{60}Co_{20}B_{20}4$, $Fe_{70}B_{30}7/Fe_{60}Co_{20}B_{20}5$, and $Fe_{60}Co_{20}B_{20}4/Fe_{70}B_{30}8$ provide A results between 1000 and 1200, a considerable improvement over prior art bilayers.

having a $Fe_xCo_yB_z$ total free layer composition where x is 66-80, y is 5-9, z is 15-28, and x+y+z=100 provide A results between 1000 and 1200, but the most desirable A results (1170-1414) are generated by trilayers with the $Fe_xCo_yB_z$ composition. All compositions shown in Table 1 and in FIG. 9 are free layers as deposited and do not account for any M elements that may have diffused into the free layer during p-MTJ fabrication.

Figure 10:
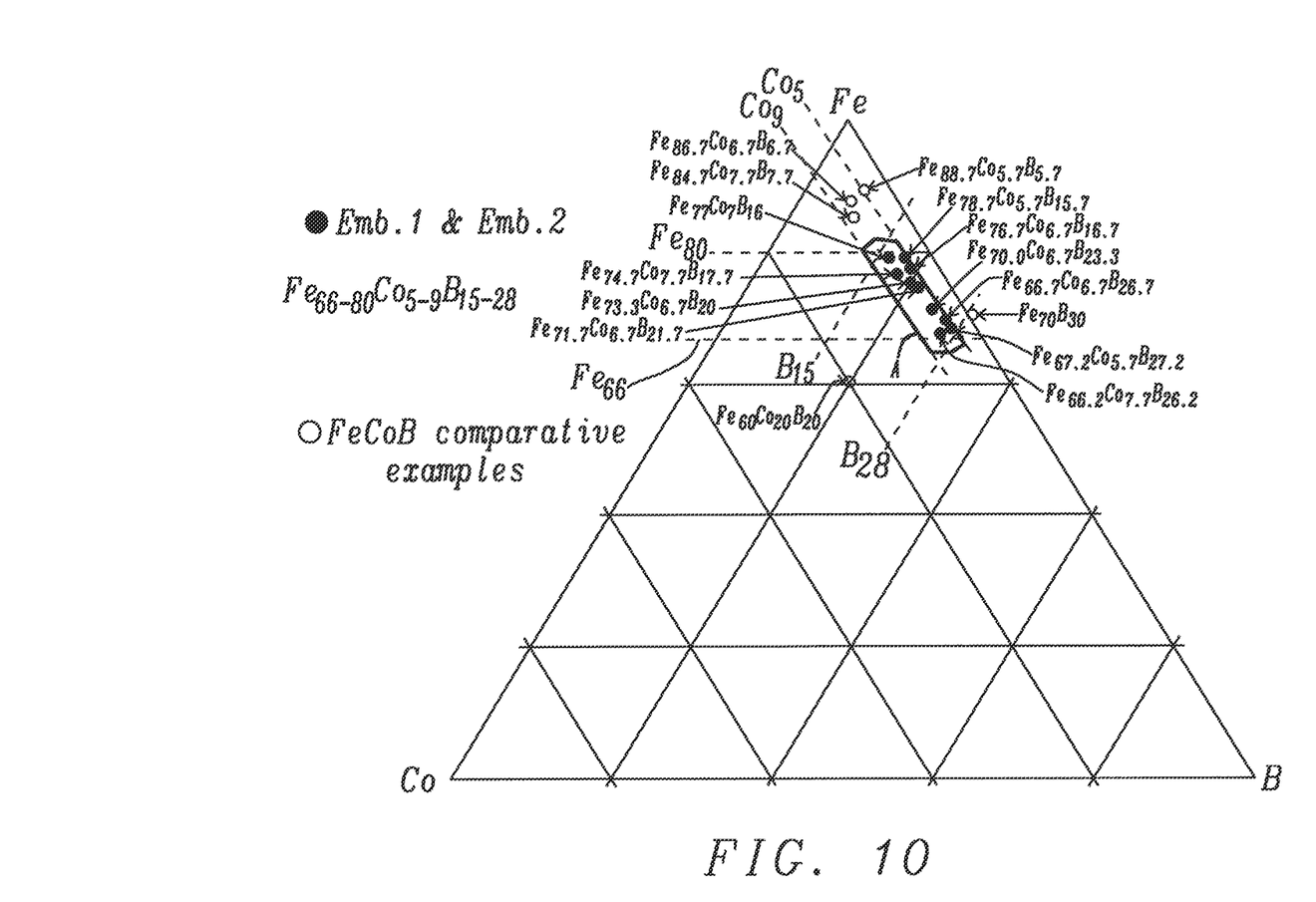
FIG. 10 is a ternary plot of Fe, Co, and B composition showing the free layer composition region represented by the embodiments of the present disclosure, and outlying regions typical of the prior art.

FIG. 10 is a FeCoB alloy graph that shows the preferred region A comprised of solid circles for achieving RA product <5 ohm/$\square$m$^2$, MR ratio >100%, and thermal stability to 400° C. Note that switching voltage was not measured since the p-MTJ stacks were not patterned. However, Vc is expected to be <0.15V (DC) in view of p-MTJ stacks with

TABLE 1

P-MTJ properties with TaN20/Mg7/CoFeB9/NiCr50/(Ni6/Co1.8)3/Co5/Ru4/Co5/Mo2/ CoFeB4/Fe5/MgO/free layer/Mo20/Ta15/Ru100 stack annealed at 400° C. for 140 min.

| | Free Layer (Total thickness = 12 Angstroms) | Total FeCoB | FL type | Hk (kOe) | MR ratio (%) | A = Hk x MR ratio | Rel. merit |
|---|---|---|---|---|---|---|---|
| Comp. Ex. 1 | $Fe_{60}Co_{20}B_{20}12$ | $Fe_{60}Co_{20}B_{20}$ | 1LR | 7.5 | 98 | 735 | 0 |
| Comp. Ex. 2 | $Fe_{70}Co_{30}$ | $Fe_{70}Co_{30}$ | 1LR | 7.0 | 90 | 630 | 0 |
| Emb. 1 | $Fe_{77}Co_7B_{16}12$ | $Fe_{77}Co_7B_{16}$ | 1LR | 9.5 | 115 | 1093 | 1 |
| Comp. Ex. 3 | $Fe8/Fe_{60}Co_{20}B_{20}4$ | $Fe_{86.7}Co_{6.7}B_{6.7}$ | 2LR | 3.5 | 120 | 420 | 0 |
| Emb. 1 | $Fe_{70}Co_{30}8/Fe_{60}Co_{20}B_{20}4$ | $Fe_{66.7}Co_{6.7}B_{26.7}$ | 2LR | 9.6 | 108 | 1037 | 1 |
| Emb. 1 | $Fe_{70}Co_{30}7/Fe_{60}Co_{20}B_{20}5$ | $Fe_{65.8}Co_{8.3}B_{25.8}$ | 2LR | 9.6 | 123 | 1181 | 2 |
| Comp. Ex. 4 | $Fe_{60}Co_{20}B_{20}4/Fe8$ | $Fe_{86.7}Co_{6.7}B_{6.7}$ | 2LR | 4.0 | 55 | 220 | 0 |
| Emb. 1 | $Fe_{60}Co_{20}B_{20}4/Fe_{70}Co_{30}8$ | $Fe_{66.7}Co_{6.7}B_{26.7}$ | 2LR | 9.2 | 130 | 1196 | 2 |
| Comp. Ex. 5 | $Fe4/Fe_{60}Co_{20}B_{20}4/Fe4$ | $Fe_{88}Co_6B_6$ | 3LR | 3.5 | 110 | 385 | 0 |
| Emb. 2 | $Fe_{70}B_{30}4/Fe_{60}Co_{20}B_{20}4/Fe4$ | $Fe_{76.7}Co_{6.7}B_{16.7}$ | 3LR | 9.4 | 139 | 1307 | 4 |
| Emb. 2 | $Fe_{70}B_{30}4/Fe_{60}Co_{20}B_{20}4/Fe_{90}B_{10}4$ | $Fe_{73.3}Co_{6.7}B_{20}$ | 3LR | 9.3 | 137 | 1274 | 3 |
| Emb. 2 | $Fe_{70}B_{30}4/Fe_{60}Co_{20}B_{20}4/Fe_{85}B_{15}4$ | $Fe_{71.7}Co_{6.7}B_{21.7}$ | 3LR | 9.2 | 130 | 1196 | 2 |
| Emb. 2 | $Fe_{70}B_{30}4/Fe_{60}Co_{20}B_{20}4/Fe_{80}B_{20}4$ | $Fe_{70}Co_{6.7}B_{23.3}$ | 3LR | 9.0 | 131 | 1179 | 2 |
| Emb. 2 | $Fe_{70}B_{30}4/Fe_{60}Co_{20}B_{20}4/Fe_{70}B_{30}4$ | $Fe_{66.7}Co_{6.7}B_{26.7}$ | 3LR | 9.0 | 133 | 1197 | 2 |
| Comp. Ex. 6 | $Fe4/Fe_{60}Co_{20}B_{20}4.6/Fe3.4$ | $Fe_{84.7}Co_{7.7}B_{7.7}$ | 3LR | 3.5 | 110 | 385 | 0 |
| Emb. 2 | $Fe_{70}B_{30}4/Fe_{60}Co_{20}B_{20}4.6/Fe3.4$ | $Fe_{74.7}Co_{7.7}B_{17.7}$ | 3LR | 10.4 | 136 | 1414 | 5 |
| Emb. 2 | $Fe_{70}B_{30}4/Fe_{60}Co_{20}B_{20}4.6/Fe_{70}B_{30}3.4$ | $Fe_{66.2}Co_{7.7}B_{26.2}$ | 3LR | 9.0 | 130 | 1170 | 2 |
| Comp. Ex. 7 | $Fe4/Fe_{60}Co_{20}B_{20}3.4/Fe4.6$ | $Fe_{88}Co_{5.7}B_{5.7}$ | 3LR | 4.5 | 92 | 414 | 0 |
| Emb. 2 | $Fe_{70}B_{30}4/Fe_{60}Co_{20}B_{20}3.4/Fe4.6$ | $Fe_{78.7}Co_{5.7}B_{15.7}$ | 3LR | 9.0 | 133 | 1197 | 2 |
| Emb. 2 | $Fe_{70}B_{30}4/Fe_{60}Co_{20}B_{20}3.4/Fe_{70}B_{30}4.6$ | $Fe_{67.2}Co_{5.7}B_{27.2}$ | 3LR | 9.6 | 124 | 1190 | 2 |

Trilayer configurations from our prior p-MTJ development studies are listed as $Fe4/Fe_{60}Co_{20}B_{20}4/Fe4$ (Comp. Ex. 5), $Fe4/Fe_{60}Co_{20}B_{20}4.6/Fe3.4$ (Comp. Ex. 6), and $Fe4/Fe_{60}Co_{20}B_{20}3.4/Fe4.6$ (Comp. Ex. 7). Again, there is no improvement over the baseline results in Comp. Ex. 1 and 2. In comparison, all Embodiment 2 trilayer examples have A results above 1000, and in several cases, have an A value substantially higher than the Embodiment 1 (single layer or bilayer) configurations. For instance, the $Fe_{70}B_{30}4/Fe_{60}Co_{20}B_{20}4/Fe4$ and $Fe_{70}B_{30}4/Fe_{60}Co_{20}B_{20}4.6/Fe3.4$ examples according to the present disclosure have the best A results of 1307 and 1414, respectively. The latter is almost 2× higher than the Comp. Ex. 1 baseline value of 735. The $Fe_{70}B_{30}4/Fe_{60}Co_{20}B_{20}4/Fe_{90}B_{10}4$ trilayer also provides enhanced A results above 1200.

The results from Table 1 are displayed in bar chart form in FIG. 9. In summary, single layer or bilayer configurations a total FL composition of $Fe_xCo_yB_z$ that have been patterned and characterized in other experiments that are not reported here. Outlying regions with open circles contain comparative example configurations shown in Table 1. In review, the comparative examples fail to provide desirable A values because Hk is degraded due to free layer intermixing with the Mo Hk enhancing layer. In general, MR ratio is below 100% in the outlying regions to further reduce the A result.

As mentioned earlier, free layer 14 in FIG. 1 and FIG. 2 may have a thickness from 8 to 15 Angstroms in either a single layer (as deposited) or triple layer configuration. Table 2 shows possible thicknesses of each layer in a $Fe_{70}B_{30}/Fe_{60}Co_{20}B_{20}/Fe$ trilayer configuration that conforms to the $Fe_xCo_yB_z$ total free layer composition according to an embodiment of the present disclosure.

TABLE 2

Trilayer stacks with thickness from 8 to 15 Angstroms, and total FL composition $Fe_xCo_yB_z$ where $x = 66\text{-}80, y = 5\text{-}9, z = 15\text{-}28$ and $x + y + z = 100$.

| Total FL thickness | FL 14-1 | FL 14-2 | FL 14-3 | $Fe_xCo_yB_z$ |
|---|---|---|---|---|
| 15 Angstroms | $Fe_{70}B_{30}$ 5 | $Fe_{60}Co_{20}B_{20}$ 5 | Fe 5 | $Fe_{76.7}Co_{6.7}B_{16.7}$ |
| 14 Angstroms | $Fe_{70}B_{30}$ 5 | $Fe_{60}Co_{20}B_{20}$ 5 | Fe 4 | $Fe_{75.0}Co_{7.1}B_{17.9}$ |
| 13 Angstroms | $Fe_{70}B_{30}$ 4 | $Fe_{60}Co_{20}B_{20}$ 5 | Fe 4 | $Fe_{75.4}Co_{7.7}B_{16.9}$ |
| 12 Angstroms | $Fe_{70}B_{30}$ 3.5 | $Fe_{60}Co_{20}B_{20}$ 4.5 | Fe 4 | $Fe_{76.3}Co_{7.5}B_{16.3}$ |
| 11 Angstroms | $Fe_{70}B_{30}$ 3.5 | $Fe_{60}Co_{20}B_{20}$ 4 | Fe 3.5 | $Fe_{75.9}Co_{7.3}B_{16.8}$ |
| 10 Angstroms | $Fe_{70}B_{30}$ 3.5 | $Fe_{60}Co_{20}B_{20}$ 3.5 | Fe 3 | $Fe_{75.5}Co_{7.0}B_{17.5}$ |
| 9 Angstroms | $Fe_{70}B_{30}$ 3 | $Fe_{60}Co_{20}B_{20}$ 3 | Fe 3 | $Fe_{76.7}Co_{6.7}B_{16.7}$ |
| 8 Angstroms | $Fe_{70}B_{30}$ 2.5 | $Fe_{60}Co_{20}B_{20}$ 3 | Fe 2.5 | $Fe_{75.8}Co_{7.5}B_{16.9}$ |

Table 3 shows possible thicknesses of each layer in a $Fe_{70}B_{30}/Fe_{60}Co_{20}B_{20}/Fe_{70}B_{30}$ trilayer configuration that conforms to the $Fe_xCo_yB_z$ total free layer composition according to an embodiment of the present disclosure.

TABLE 3

Trilayer stacks with thickness from 8 to 15 Angstroms, and total FL composition $Fe_xCo_yB_z$ where $x = 66\text{-}80, y = 5\text{-}9, z = 15\text{-}28$ and $x + y + z = 100$.

| Total FL thickness | FL 14-1 | FL 14-2 | FL 14-3 | $Fe_xCo_yB_z$ |
|---|---|---|---|---|
| 15 Angstroms | $Fe_{70}B_{30}$ 5 | $Fe_{60}Co_{20}B_{20}$ 5 | $Fe_{70}B_{30}$ 5 | $Fe_{66.7}Co_{6.7}B_{26.7}$ |
| 14 Angstroms | $Fe_{70}B_{30}$ 5 | $Fe_{60}Co_{20}B_{20}$ 5 | $Fe_{70}B_{30}$ 4 | $Fe_{66.4}Co_{7.1}B_{26.4}$ |
| 13 Angstroms | $Fe_{70}B_{30}$ 4 | $Fe_{60}Co_{20}B_{20}$ 5 | $Fe_{70}B_{30}$ 4 | $Fe_{66.2}Co_{7.7}B_{26.2}$ |
| 12 Angstroms | $Fe_{70}B_{30}$ 3.5 | $Fe_{60}Co_{20}B_{20}$ 4.5 | $Fe_{70}B_{30}$ 4 | $Fe_{66.3}Co_{7.5}B_{26.3}$ |
| 11 Angstroms | $Fe_{70}B_{30}$ 3.5 | $Fe_{60}Co_{20}B_{20}$ 4 | $Fe_{70}B_{30}$ 3.5 | $Fe_{66.4}Co_{7.3}B_{26.4}$ |
| 10 Angstroms | $Fe_{70}B_{30}$ 3.5 | $Fe_{60}Co_{20}B_{20}$ 3.5 | $Fe_{70}B_{30}$ 3 | $Fe_{66.5}Co_{7.0}B_{26.5}$ |
| 9 Angstroms | $Fe_{70}B_{30}$ 3 | $Fe_{60}Co_{20}B_{20}$ 3 | $Fe_{70}B_{30}$ 3 | $Fe_{66.7}Co_{6.7}B_{26.7}$ |
| 8 Angstroms | $Fe_{70}B_{30}$ 2.5 | $Fe_{60}Co_{20}B_{20}$ 3 | $Fe_{70}B_{30}$ 2.5 | $Fe_{66.3}Co_{7.5}B_{26.3}$ |

Figure 11:
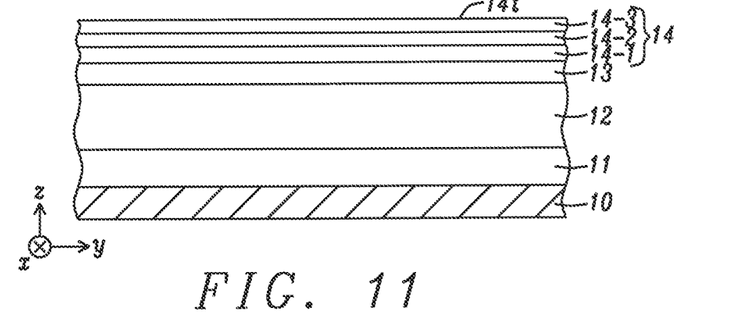
FIGS. 11-13 show a sequence of steps used to fabricate a p-MTJ according to an embodiment of the present disclosure.
Figure 12:
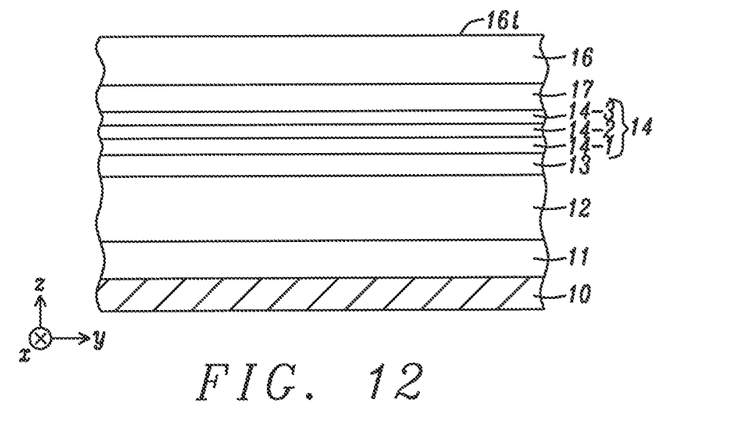
Figure 13:
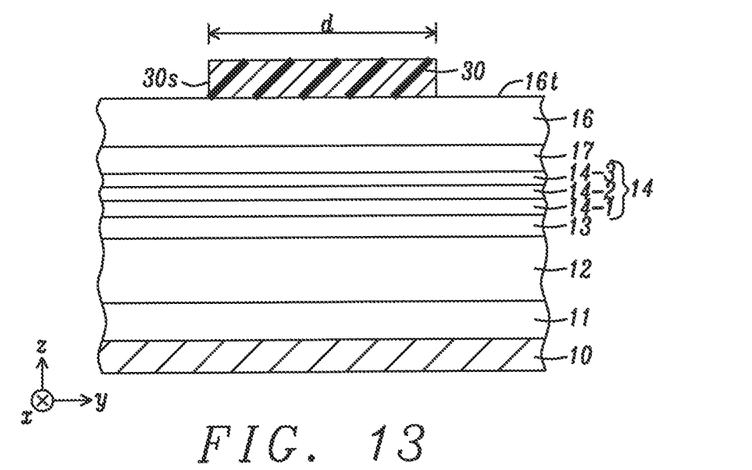

A sequence of steps in FIGS. 11-13 show one process flow for forming a p-MTJ cell having a free layer 14 formed between a tunnel barrier layer 13, and a Hk enhancing layer 17 that is W, Mo, Mo alloy or a W alloy. Referring to FIG. 11, seed layer 11, reference layer 12, and tunnel barrier 13 are sequentially formed on bottom electrode 10 by conventional methods. Thereafter, free layer 14 having top surface 14t is formed with sequential deposition of a FeB layer 14-1, FeCoB layer 14-2, and Fe or FeB layer 14-3 explained previously. All free layers are sputter deposited within a chamber having a base pressure of $5\times10^{-8}$ to $5\times10^{-9}$ torr, and typically using a sputter gas that is Ar. Preferably, layer 14-2 comprises more Co (higher Co content) than in layer 14-1 or in layer 14-3. Moreover, layer 14-3 preferably comprises a higher Fe content than in layer 14-2, and a B content ≤30 atomic %.

Referring to FIG. 12, a Hk enhancing layer 17 made of Mo, W, W alloy, or a Mo alloy may be sputter deposited on top surface 14t in the same chamber used for depositing free layer 14. Thereafter, hard mask 16 with top surface 16t is deposited on the Hk enhancing layer.

Referring to FIG. 13, a photoresist layer is coated on top surface 16t and patterned by a conventional photolithography technique to yield a pattern comprised of island 30 with sidewall 30s and a critical dimension (CD)=d in the y-axis direction. Note that a dielectric anti-reflective coating (DARC) or bottom anti-reflective coating (BARC) known in the art is generally formed between top surface 16t and the photoresist layer to improve the process window and CD uniformity in a plurality of islands (not shown) across the substrate (wafer) but is not shown in this illustration. In some embodiments, the CD is also formed in the x-axis direction to give a circular island shape from a top-down view. However, the CD in the x-axis direction may be different from d so that the island has an elliptical or polygonal shape from a top-down perspective.

One or more reactive ion etch (RIE) steps are employed to transfer the photoresist sidewall through the p-MTJ layers, and stop on top surface 10t of the bottom electrode 10 as depicted in FIG. 1. As a result, sidewall is on p-MTJ 1 is formed as a extension of sidewall 30s. The photoresist island is removed during the etch transfer and hard mask 16 ensures that the shape integrity (CD) of the original island shape 30 is preserved in the resulting p-MTJ cell. An ion beam etch may be used to remove RIE residue before a subsequent encapsulation layer (not shown) is deposited to insulate p-MTJ 1 from adjacent p-MTJ cells. A first anneal at >380° C. may be performed before the photoresist is coated and patterned. Furthermore, one or more processing steps including anneals at temperatures >380° C. may occur after p-MTJ 1 is formed according to various embodiments of the present disclosure. It is believed that the free layer will become crystalline after annealing in all embodiments considering the iron rich content of all layers in single layer, bilayer, and trilayer configurations described herein. Accordingly, the crystalline free layer should enable good lattice matching with a MgO tunnel barrier layer and with the Hk enhancing layer, which both have a body centered cubic (bcc) crystal structure after annealing.

Figure 14:
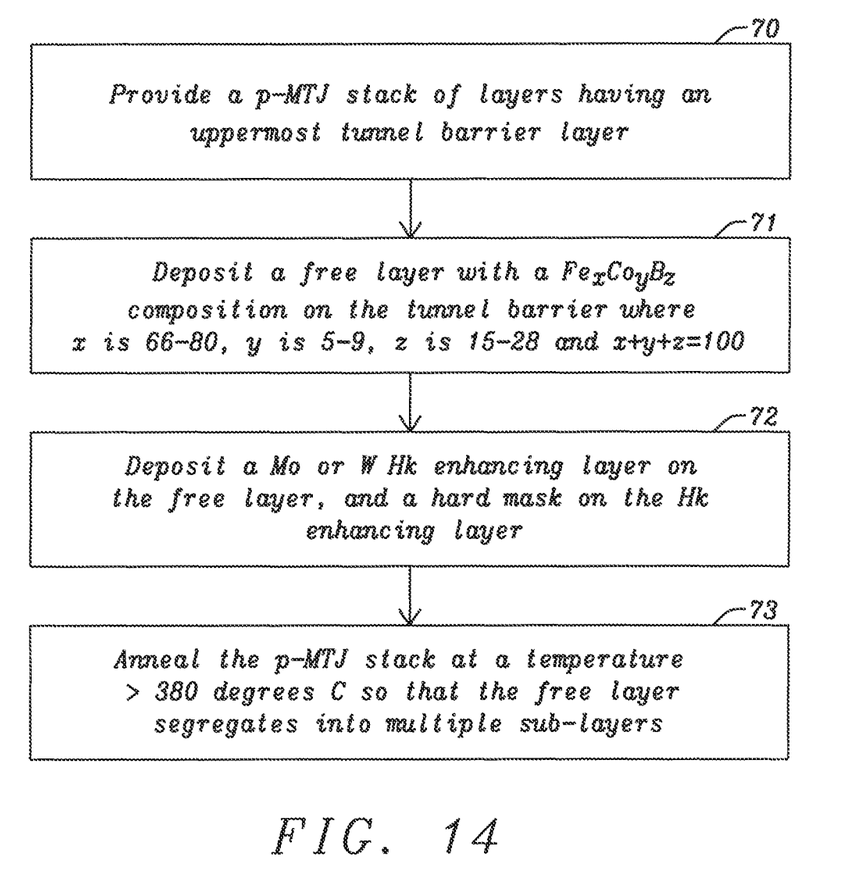
FIG. 14 is a flow diagram depicting a series of steps where a $Fe_xCo_yB_z$ free layer is formed between a tunnel barrier layer and Mo or W Hk enhancing layer in a p-MTJ stack of layers.

Referring to FIG. 14, a process flow diagram is provided for an alternative embodiment where a single free layer with a $Fe_xCo_yB_z$ composition where x is 66-80, y is 5-9, z is 15-28, and x+y+z=100 is formed between a tunnel barrier layer and a Hk enhancing layer. In the exemplary embodiment that relates to formation of a p-MTJ stack of layers with a bottom spin valve configuration, a p-MTJ stack of layers is provided with an uppermost tunnel barrier layer in step 70. Thereafter, in step 71, a $Fe_xCo_yB_z$ free layer is deposited on the tunnel barrier layer. An Hk enhancing layer such as W, Mo, W alloy, or a Mo alloy, and an optional hard mask are sequentially formed on the free layer in step 72. Finally, the p-MTJ stack is annealed at a temperature >380° C. in step 73 so that the free layer may segregate into multiple sub-layers, and may absorb one or more M elements described previously. Alternatively, the sequence of steps is reversed so that the free layer is deposited on the Hk enhancing layer, and then the tunnel barrier is formed on the free layer when forming a top spin valve configuration. All of the aforementioned steps may be carried out within various chambers of a sputter deposition tool.

All of the embodiments described herein may be incorporated in a manufacturing scheme with standard tools and processes. P-MTJ cells formed according to preferred embodiments disclosed herein have a RA product below 5 ohm/$\square m^2$, MR ratio >100%, Vc <0.15V (DC), and sufficient Hk to provide thermal stability to 400° C. process temperatures. We believe overall p-MTJ performance is an improvement over the prior art and thereby enables higher process yields of advanced product nodes such 64 Mb and 256 Mb STT-MRAM technology, and related spintronic devices where switching current, RA value, MR ratio, and thermal stability are all critical parameters.

While the present disclosure has been particularly shown and described with reference to, the preferred embodiment thereof, it will be understood by those skilled in the art that various changes in form and details may be made without departing from the spirit and scope of this disclosure.

What is claimed is:

1. A device comprising:
   a stack of magnetic tunnel junction (MTJ) layers that includes a reference layer, a Hk enhancing layer, a tunnel barrier layer and a free layer, wherein the free layer is comprised of at least Fe, Co, and B in a composition that is $Fe_xCo_yB_z$ in which x is 66-80, y is 5-9, z is 15-28, and x+y+z=100, and wherein the free layer comprises a first layer that includes FeB, a second layer that includes FeCoB and a third layer that includes Fe, wherein the second layer has a higher Co content than the first layer and the third layer has a higher Fe content than the second layer.

2. The device of claim 1, wherein the free layer is crystalline and has lattice matching with the tunnel barrier layer and the Hk enhancing layer, and
   wherein each of the tunnel barrier layer and the Hk enhancing layer have a body centered cubic (bcc) crystalline structure.

3. The device of claim 1, further comprising a bottom electrode, and
   wherein the reference layer is positioned closer to the bottom electrode than the free layer.

4. The device of claim 1, further comprising a bottom electrode, and
   wherein the free layer is positioned closer to the bottom electrode than the reference layer.

5. The device of claim 1, wherein the tunnel barrier layer includes a metal oxide material, and
   wherein the Hk enhancing layer includes a material selected from the group consisting of W, Mo, and alloys thereof.

6. The device of claim 1, wherein the first layer that includes FeB interfaces with the second layer that includes FeCoB, and
   wherein the third layer that includes Fe interfaces with the second layer that includes FeCoB.

7. The device of claim 1, wherein the free layer further includes one or more M elements,
   where M is oxygen, nitrogen, or a metal, and
   wherein a free layer composition is $(Fe_xCo_yB_z)_wM_{100-w}$ such that w is >90 atomic %.

8. A device comprising:
   an electrode layer; and
   a stack of magnetic tunnel junction (MTJ) layers disposed on the electrode layer, the stack of MTJ layers including a Hk enhancing layer, a tunnel barrier layer and a free layer, wherein the free layer is comprised of at least Fe, Co, and B in a composition that is $Fe_xCo_yB_z$ in which x is 66-80, y is 5-9, z is 15-28, and x+y+z=100, wherein the free layer comprises a first portion, a second portion disposed over the first portion and a third portion disposed over the second portion, and wherein the second portion has a higher Co content than the first portion and the third portion has a higher Fe content than the second portion.

9. The device of claim 8, wherein the second portion has a higher Co content than the third portion.

10. The device of claim 8, wherein the free layer further includes a material selected from the group consisting of oxygen and nitrogen.

11. The device of claim 8, wherein the Hk enhancing layer includes a material selected from the group consisting of W and Mo.

12. The device of claim 8, further comprising a seed layer and a reference layer,
   wherein the seed layer is disposed over the electrode layer,
   wherein the reference layer is disposed over the seed layer,
   wherein the tunnel barrier layer is disposed over the reference layer,
   wherein the free layer is disposed over the tunnel barrier layer, and
   wherein the Hk enhancing layer is disposed over the free layer.

13. The device of claim 8, further comprising a seed layer and a reference layer,
   wherein the seed layer is disposed over the electrode layer,
   wherein the Hk enhancing layer is disposed over the seed layer,
   wherein the free layer is disposed over the Hk enhancing layer,
   wherein the tunnel barrier layer is disposed over the free layer, and
   wherein the reference layer is disposed over the tunnel barrier layer.

14. The device of claim 8, wherein the first portion includes FeB,
   wherein the second portion includes FeCoB, and
   wherein the third portion includes Fe.

15. A device comprising:
   a stack of magnetic tunnel junction (MTJ) layers including a Hk enhancing layer, a tunnel barrier layer and a free layer, wherein the free layer is comprised of at least Fe, Co, and B in a composition that is $Fe_xCo_yB_z$, wherein x is greater than y and y is less than z, wherein the free layer comprises a first portion, a second portion and a third portion, and wherein the second portion has a higher Co content than the first portion and the third portion has a higher Fe content than the second portion.

16. The device of claim 15, wherein the free layer further includes a material M selected from the group consisting of oxygen, nitrogen, and a metal,
   wherein x is 66-80, y is 5-9, z is 15-28, and x+y+z=100, and
   wherein a free layer composition is $(Fe_xCo_yB_z)_wM_{100-w}$ such that w is >90 atomic %.

17. The device of claim 15, wherein at least one of the tunnel barrier layer and the Hk enhancing layer have a body centered cubic (bcc) crystalline structure.

18. The device of claim 15, wherein the first portion of the free layer interfaces with the tunnel barrier layer, and
   wherein the third portion interfaces with the Hk enhancing layer.

19. The device of claim 15, therein the tunnel barrier layer includes a material selected from the group consisting of MgO, TiOx, AlTiO, MgZnO, $Al_2O_3$, ZnO, ZrOx, HfOx and MgTaO.

20. The device of claim 8, wherein at least one of the tunnel barrier layer and the Hk enhancing layer have a body centered cubic (bcc) crystalline structure.

* * * * *